United States Patent [19]
Babacz

[11] Patent Number: 5,374,314
[45] Date of Patent: Dec. 20, 1994

[54] METHODS AND APPARATUS FOR EXTERNALLY TREATING A CONTAINER WITH APPLICATION OF INTERNAL BIAS GAS

[75] Inventor: Robert J. Babacz, Bethlehem, Pa.

[73] Assignee: Polar Materials, Inc., Martins Creek, Pa.

[21] Appl. No.: 183,609

[22] Filed: Jan. 18, 1994

Related U.S. Application Data

[62] Division of Ser. No. 904,974, Jun. 26, 1992, Pat. No. 5,308,649.

[51] Int. Cl.$^5$ ............................................... C23C 16/50
[52] U.S. Cl. ......................... 118/723 MP; 118/723 E; 118/723 R; 118/724; 118/728; 118/733
[58] Field of Search ..... 118/723 MP, 723 E, 723 ER, 118/724, 728, 733; 156/345

[56] References Cited

U.S. PATENT DOCUMENTS

| | | | |
|---|---|---|---|
| 4,230,068 | 10/1980 | Itoh et al. | 118/634 |
| 4,478,874 | 10/1984 | Hahn | 427/40 |
| 4,746,538 | 5/1988 | Mackowski | 427/237 X |
| 4,894,256 | 1/1990 | Gäntner et al. | 427/237 X |
| 5,176,924 | 1/1993 | Williams | 118/723 E X |

Primary Examiner—R. Bruce Breneman
Assistant Examiner—Jonathan D. Baskin
Attorney, Agent, or Firm—Lerner, David, Littenberg, Krumholz & Mentlik

[57] ABSTRACT

The exterior surface of a hollow container is treated under the influence of an electric field. The electric field is applied through an electrode and an electrically conductive gas inside the container. The electrically conductive gas conducts a potential from the electrode to the inside surface of the container.

14 Claims, 2 Drawing Sheets

METHODS AND APPARATUS FOR EXTERNALLY TREATING A CONTAINER WITH APPLICATION OF INTERNAL BIAS GAS

This is a division of application Ser. No. 07/904,974 filed Jun. 26, 1992, U.S. Pat. No. 5,308,649.

FIELD OF THE INVENTION

The present invention relates to an apparatus and a method for biasing the surface of a polymeric substrate such as a container to enhance the formation of barrier coatings on the external portions of such substrates.

BACKGROUND OF THE INVENTION

Containers for chemically sensitive materials such as food products traditionally have been made from inorganic materials such as glass. Glass containers are transparent and permit the consumer to view the product before purchasing it. Moreover, glass containers are essentially impermeable to atmospheric gases such as oxygen and hence protect the product. However, glass containers are expensive, heavy and susceptible to breakage. Accordingly, considerable effort has been devoted to development of containers made from polymeric materials such as thermoplastics. Thermoplastic containers can be made inexpensively. They are light in weight and hence inexpensive to ship. They are resistant to breakage and can be fabricated in convenient shapes.

However, polymeric containers ordinarily are permeable to atmospheric gases and to gases in the packaged product. This drawback has limited the use of polymeric containers in many applications. Various approaches have been taken towards eliminating the permeability of polymeric containers. Certain polymers have relatively low permeability to particular gases. Containers fabricated from these polymers sometimes can provide satisfactory resistance to permeation for particular applications. However, use of these particular, low permeability polymers can introduce additional problems of cost, transparency, or strength. In certain cases, the low permeability polymers are incompatible with the product to be contained. To alleviate these drawbacks composite containers incorporating one or more layers of a low permeability polymer in conjunction with layers of other polymers have been used. This approach is costly and can make it more difficult to recycle the containers using common recycling techniques such as melt processing.

Various proposals have been advanced for rendering polymeric materials less permeable to oxygen and other gases by depositing thin films incorporating inorganic materials such as oxides of silicon on a substrate consisting of the polymeric material. Such deposition coating is enhanced by applying an electrical potential to the substrate being coated. For example, an acceptable barrier coating can be formed on flat substrates by placing such flat substrates on an electrically conductive plate and electrically coupling the plate to a direct current, audio frequency or radio frequency power supply, while reactive oxides and organosilicon gas react in the vicinity of the substrate.

In Applicant's copending commonly assigned U.S. patent application Ser. No. 07/889,637, entitled METHODS AND APPARATUS FOR DEPOSITING BARRIER COATINGS, filed with the U.S. Patent and Trademark Office on May 28, 1992, a method and apparatus for depositing barrier coatings on polymeric substrates such as containers is disclosed. The copending application teaches the conversion of an oxidizing gas into plasma in a plasma zone remote from a treatment chamber. The resulting plasma-activated oxidizing species may be delivered to the vicinity of a thermoplastic container. An organosilicon reactant vapor is separately and simultaneously delivered to the vicinity of the container so that the organosilicon vapor and oxidizing active species mix in proximity to the container where they react. The products of the reaction are deposited on the container. The copending application further discloses the use of an electric field which is applied to the container, so that the reaction products are deposited under the influence of the electric field to form the barrier coating. In this process, the coated surface is treated by electrically charged species in the gaseous reaction mix. In certain preferred embodiments, the coating is deposited on the inside of the container, and a biasing voltage is applied to the outside of the container by an electrically conductive shell which surrounds the container.

In other processes, surfaces can be treated with electrically charged species for purposes other than coating. Merely by way of example, such processes may be used for surface activation, cleaning, polymer grafting and other tasks. Where these and other electric-field-assisted treatment processes are employed to treat the outside of a container, the biasing voltage should be applied from inside the container. However, it has been difficult heretofore to uniformly bias the wall of a rigid container by uniformly applying an electric charge to the inner surface of the container. Prior efforts to apply a uniform electric charge to the inner surface of a container, especially a narrow-neck container, using mechanical means such as metal objects in the container have encountered drawbacks.

For example, Mackowski, U.S. Pat. No. 4,746,538, discloses the use of a radially expandable cathode disposed within a glass bottle to aid in the coating of the exterior of same. Such devices can be fragile and slow to operate, and can contaminate the interior of the container.

Despite the efforts disclosed in the aforementioned prior art reference, as well as other substantial efforts in the art, there are needs for improved methods and apparatus for uniformly applying an electrical bias from the inside of a container during a treatment processes. The present invention fulfills these needs.

SUMMARY OF THE INVENTION

One aspect of the present invention provides a method of treating the outside of an article such as a polymeric container. A method according to this aspect of the invention preferably includes the steps of providing a first gas to the interior of the article so that the gas substantially fills the article, and maintaining the first gas in an electrically conductive state, as by ionizing the first gas. A second gas, including electrically charged species is provided on the exterior of the article. The second gas desirably has a different chemical composition than the first gas. The article itself most preferably serves as an isolation device to isolate the first gas in its interior from the second gas on the exterior of the article. The method further includes the step of applying an electrical potential to a first electrode in contact with the conductive first gas. Thus, the conductive first gas transfers the potential from the electrode to the interior surface of the article. In this way, the interior surface of the article can be maintained at a controlled, desirably uniform, potential. The electrically charged species in the second gas interact with the exterior surface of the article under the influence of such potential. The conductive gas can be provided readily throughout the article regardless of its shape. Although the first electrode desirably but optionally protrudes into the interior of the article, it is not necessary for the first electrode to contact the interior surface of the article.

In a particularly preferred method according to this aspect of the present invention, the article is a hollow polymeric container such as a bottle having an opening. The polymeric container is situated in a treatment chamber and is mounted in the treatment chamber so that the elastomer seal engages the container wall portions surrounding the opening, thus isolating the opening from the space within the treatment chamber outside of the container. The second gas may be provided in the vacuum chamber under subatmospheric pressure. The step of providing the first gas to the interior of the container may be conducted using a hollow electrode which serves both as an electrode in contact with the first gas and as a conduit for transporting the first gas between a gas source and the interior of the container. The electrode has perforations in an end disposed within the container which provide a flow path allowing the first gas to exit from the electrode conduit into the container. It is preferable to maintain this first gas under a subatmospheric pressure so that it can be more readily excited upon application of an electrical potential to the electrode. Thus, the conductive gas is maintained in an electrically conductive state and uniformly transfers the electric potential from the electrode to the surface of the container. The first gas applied within the container may be substantially inert, and need not react With the container. Alternatively, the first gas may be selected to bring about a desired reaction inside the container.

In a coating process according to this aspect of the invention, the second gas on the outside of the article may include reactive gas species capable of forming a coating. For example, the second gas may include activated oxygen-containing gas species and an organosilicon vapor. The steps of providing the activated species and the organosilicon vapor may be conducted, in accordance with the aforementioned copending application, so as to convert an oxygen-bearing gas into a plasma in a plasma zone remote from the container, whereby the plasma may form activated species. The activated species and the organosilicon vapor may be separately delivered to the vacuum chamber at a location exterior to the polymeric container. Thus, the activated species and the vapor are permitted to react and form reaction products which are then deposited on the exterior of the polymeric container, thereby forming a coating on the exterior surface. The potential applied to the surface of the polymeric container differs from the potential in the surrounding treatment chamber and therefore, attracts oppositely charged ions from the gas mixture which then bombard the depositing coating on the exterior surface of the container, thereby enhancing the coating. Although the method of the present invention is not limited by any theory of operation, it is believed that the charged ions are formed by ionization in the treatment chamber or else may be drawn from the plasma zone.

The container can be rotated about an axis so as to provide a more even distribution of the reaction products and therefore a more even coating. The method may further include the step of cooling the electrode within the container to prevent undesirable heat build-up.

A further aspect of the present invention includes an apparatus for coating articles such as hollow polymeric containers. Apparatus according to this aspect of the invention includes a first electrode and first gas application means for providing a first gas on the inside of the hollow article to be treated so that said first gas contacts said electrode and substantially fills the article. The apparatus preferably also includes second gas application means for providing a second gas including electrically charged species on the outside of said article, and separation means for maintaining the second gas separate from said first gas. First potential application means are provided for maintaining the first gas in an electrically conductive state and applying a first electrical potential to said first electrode. Typically, the applied first potential at least partially ionizes the first gas, thus rendering it conductive. Thus, the first potential is substantially uniformly applied at the interior surfaces of said article. The electrically charged species in said second gas interact with the exterior surfaces of said article under the influence of said first potential.

The second gas application means preferably includes a treatment chamber defining an interior space and serving as a housing for the polymeric container to be coated. The chamber may be connected to a source of the second gas. The chamber may also be provided with exhaust ducts for providing a flow path through which excess gas can be removed, and vacuum pumps connected to these ducts for maintaining the chamber under controlled subatmospheric pressure.

The first electrode, i.e., the bias electrode, serves as an electric charge source and may also serve as a passageway permitting the first gas source to communicate with the interior of the container. The apparatus desirably includes means for positioning the hollow article and said first electrode relative to one another so that said electrode is disposed at least partially within the interior of the hollow article. The first electrode desirably provides a passageway communicating with the interior of said hollow article when said electrode is disposed within said hollow article. The first gas application means may be arranged to circulate the first gas through this passageway. The separation means for maintaining the first and second gases separate from one another may include an annular sealing element such as an elastomeric gasket encircling said first electrode. The first electrode may be elongated and may project in an axial direction from said sealing element. The means for positioning the hollow article may be arranged to position the article so that said projecting electrode extends into the article through an opening surrounded by wall structure of the article and so that said sealing element sealingly engages such surrounding wall structure. For example, where the article is a bottle having a neck surrounding the opening, the sealing element may engage the neck. The first gas application means may include means for circulating the first gas alongside said electrode, inside the annular sealing element and the article wall structure engaged therewith. Thus, the first gas may flow into the interior of the article through the electrode end out of the article through the space surrounding the electrode.

The apparatus for treating the article according to this aspect of the present invention provides a practical way to uniformly bias the surface of the container from the inside thus enhancing the coating or other treatment process on the exterior surface of such container.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
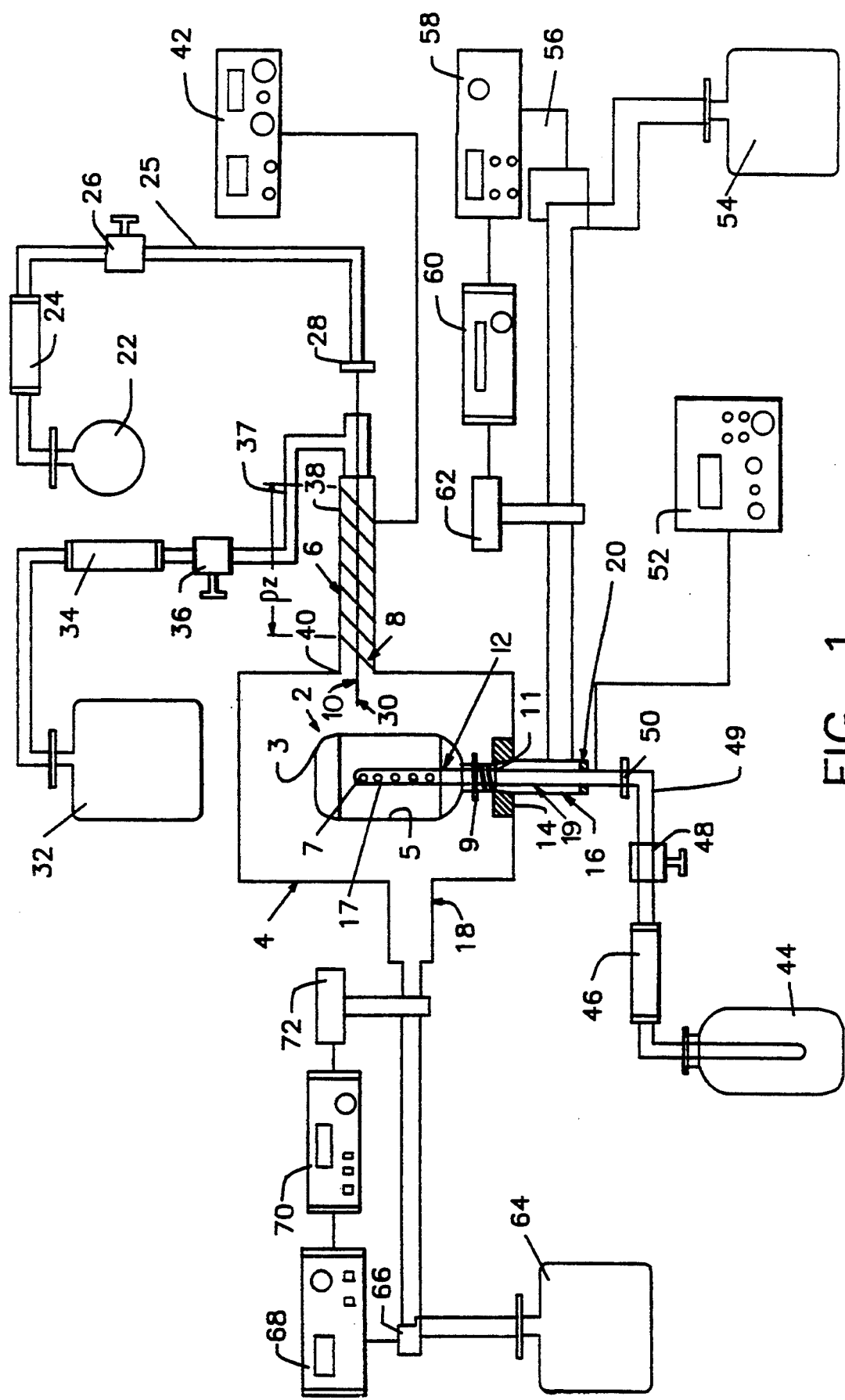
FIG. 1 is a diagrammatic, partially sectional view of apparatus according to one embodiment of the invention.

Apparatus according to one embodiment of the invention includes an electrically grounded vacuum chamber 4 formed from a conductive material such as metal or a nonconductive material such as glass or ceramic with separate grounding features (not shown). The chamber 4 has appropriate feedthroughs and openings (not shown) for inserting articles to be treated and removing the articles from the chamber. The interior of the vacuum chamber 4 is connected to a vacuum pump 64 via an exhaust conduit 18. A pressure sensor 72 arranged to detect the pressure within the chamber and to provide a signal representing that pressure to a display device 70 and to a feedback controller 68. The controller 68 in turn is arranged to actuate a throttling valve 66 which is connected between an exhaust conduit 18 and the vacuum pump 64 SO as to maintain a controlled, subatmospheric pressure within the vacuum chamber 4.

A tubular inlet conduit 6 defining a plasma zone PZ is mounted outside of the vacuum chamber 4 and has an upstream end 38 and a downstream end 40. The downstream end 40 of the inlet conduit 6 permits communication between the plasma zone PZ and the interior of the vacuum chamber 4. A conduit 10, commonly referred to as a capillary tube, formed from a tubing having a narrow diameter, preferably in the order of 10 mm, extends coaxially with the inlet conduit 6, through the center of the plasma zone PZ. The capillary tube 10 has an upstream end 28 and a downstream end 30. The downstream end 30 also provides for communication between the interior of capillary tube 10 and the interior of the Vacuum chamber 4. Preferably, the inlet conduit 6 and the capillary tube 10 are formed from a chemically resistant dielectric material such as quartz, glass or ceramic. The vacuum chamber 4 can comprise a nonconductive material, in which case it can be electrically grounded by means of a virtual ground, which will be described further hereinbelow. However, the vacuum chamber 4 can also comprise a conductive material, such as a non-reactive metal, which itself would be electrically grounded. A coating electrode 8, preferably in the form of a resonator coil, surrounds a portion of inlet conduit 6. An RF power supply 42 is electrically connected to coating electrode 8.

Figure 2:
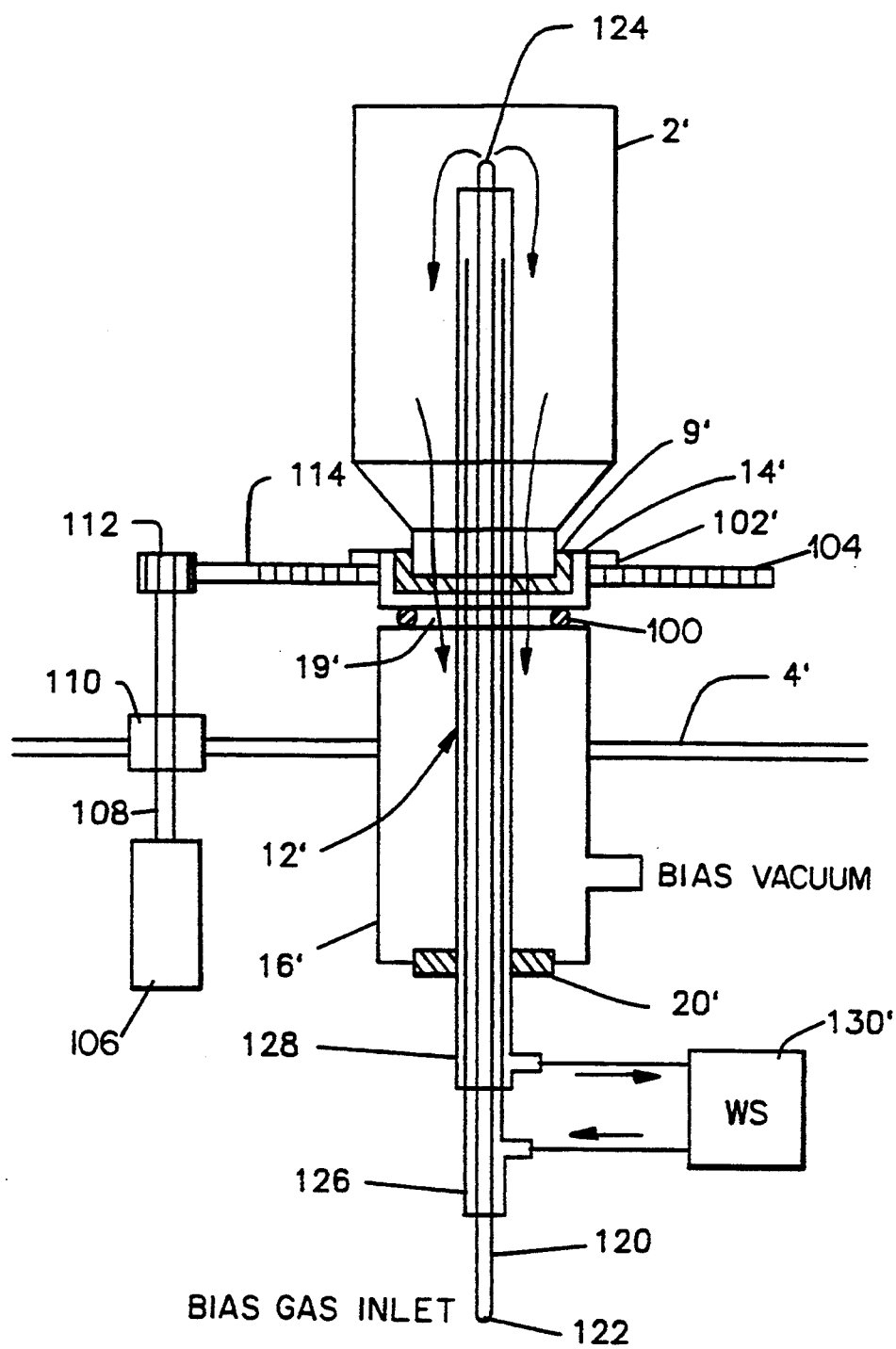
FIG. 2 is a diagrammatic, fragmentary, sectional view of apparatus according to a second embodiment of the invention.

An oxidizing gas source such as tank 32 containing the desired oxidizing gas is equipped with a conventional pressure regulator (not shown) and is connected to the upstream end 38 of the inlet conduit 6 via an oxidizing gas conduit 37. As illustrated in FIGS. 1 and 2, a flow meter 34 and an inlet control valve 36 are arranged along the oxidizing gas conduit 37 at a location between the tank 32 and the upstream end 38 of the inlet conduit 36. Such an arrangement is operable to control the pressure and the rate of flow of the oxidizing gas from the tank 32 into the vacuum chamber 4. An organosilicon gas source such as tank 22 containing organosilicon vapor is also provided. Tank 22 is similarly equipped with a conventional pressure regulator and may also be equipped with a conventional heater and control device (not shown) for vaporizing the organosilicon used. An organosilicon gas conduit 25 extends between the tank 22 and an upstream end 28 of the capillary tube 10. Preferably, a flow meter 24 and an inlet control valve 26 are arranged on the organosilicon gas conduit 25 at a location between the tank 22 and the upstream end 28 of the capillary tube 10. As further explained below, the oxidizing gas source 32 and organosilicon gas source 22, together with the intervening components and the RF source 42 are operable to supply a gas mixture to the interior of chamber 4, which gas mixture incorporates the organosilicon gas together with the oxidizing gas in an activated state.

The apparatus further includes an elongated, tubular bias gas exhaust duct 16 opening to the interior of chamber 4 and extending outwardly from the wall of the chamber. An annular elastomeric seal 14 is mounted to the interior of the chamber wall at the opening of exhaust duct 16 so that the annular elastomer seal surrounds the opening of the exhaust duct. A metallic bias electrode 12 in the form of a hollow, elongated metallic tube is mounted coaxially in duct 16 by an electrically insulating bushing 20. The exterior diameter of electrode 12 (its maximum dimension in directions transversed to its direction of elongation) is less than the interior diameter of annular seal 14 and less than the interior diameter of duct 16. Bushing 20 seals the gap between electrode 12 and the wall of duct 16 at the end of the duct remote from chamber 4. Electrode 12 is mounted so that a distal portion 17 of the electrode protrudes through the opening of exhaust duct 16 at the chamber wall and through the interior of annular seal 14 into the chamber. Thus, the exterior of electrode 12 and the interior of annular seal 14 cooperatively define a passageway 19 around the exterior of the electrode communicating with the interior of exhaust duct 16. Electrode 12 is also provided with apertures 7 on its distal region 17, the apertures extending between the interior of the tubular electrode and its exterior surface. Electrode 12 is electrically connected to a bias RF power source 52. The electrode is electrically insulated from exhaust duct 16, and from the other surrounding structures, by bushing 20.

A bias gas source such as a tank 44 is connected through a conduit 49 and a coupler 50 to the interior bore of the hollow tubular bias electrode 12 to permit gas stored within the gas source 44 to flow into the bore of electrode 12 and through the aperture 7 thereon. A flowmeter 46, a control valve 48 and a pressure regulator (not shown) are preferably arranged on the conduit 49 between the gas source 44 and the coupler 50.

Bias gas exhaust duct 16, and hence the passageway 19 surrounding the exterior of the electrode 12, are connected to a vacuum pump 54. A pressure sensor 62 is arranged to detect the pressure within the exhaust duct 16 and to provide a signal which represents the existing pressure on a display device 60, and to similarly relay that pressure signal to feedback controller 58. The feedback controller 58, in turn, is adapted to actuate a throttling valve 56 which is connected between the exhaust conduit 16 and the vacuum pump 54 so as to maintain the desired controlled pressure, preferably a subatmospheric pressure, within duct 16.

In a treatment method according to one embodiment of the invention, the apparatus is employed to treat a container 2 having a generally cylindrical hollow body with an exterior wall surface 3 and an interior wall surface 5, the container also having a generally cylindrical hollow tubular neck 9 protruding coaxially from one end of the bottle and defining an opening 11 at the end of the neck remote from the body. The container is placed into chamber 4 through an access port or hatch (not shown) and positioned within the interior of the chamber so that the distal end 17 of electrode 12 protrudes into the interior of the container and so that the neck 9 of the container is engaged with annular elastomeric seal 14. As the elastomeric seal engages the neck of the container around the entire periphery of container opening 11, and as the remainder of the container wall is imperforate, the interior space within the container 2 is isolated from the space inside chamber 4 but outside of the container. The interior of the container however, is in communication with the interior bore of electrode 12 through aperture 7. Moreover, the interior of the container is in communication with exhaust duct 16 through neck opening 11 of the container and through the annular passageway 19 surrounding the electrode. The container is physically supported within the chamber 4 by engagement of the neck 9 with the seal 14.

Supplementary support devices (not shown) may also be provided for more firmly holding the container. These may include mechanical grips, clamps and the like for engaging the container. As such grips or clamps would obstruct deposition of a coating on those portions of the external surface covered by the grips and clamps during operation, it is preferable to apply any such grips and clamps on the external surface only to the neck and/or any other region of the container exterior where absence of the deposited coating can be tolerated. Alternatively, the grips or clamps may be mounted within annular seal 14 and hence may engage the interior surface of the tubular neck 9 at opening 11. Such internal grips or clamps however should not entirely obstruct opening 11 or the annular passage way 19 surrounding the electrode.

Bias gas source 44, together with flowmeter 46 and control valve 48 are actuated to supply a first or bias gas through the interior of tubular electrode 12 and through apertures 7 to the interior space within container 2. The bias gas desirably is a readily ionizable gas such as a noble gas, particularly a so-called "noble" gas selected from Group VIII of the periodic table, i.e., helium, neon, argon, krypton, xenon and combinations thereof. Vacuum pump 54 continually withdraws gas from the interior space within the container through the opening of neck 11, the annular passageway 19 surrounding the electrode 12 within seal 14 and through exhaust duct 16. Accordingly, the bias gas supplied by source 44 continually flows into the interior of the container via aperture 7 on the electrode and out of the container through annular space 19, around the exterior of the electrode. Pressure sensor 56 and the associated feedback elements control throttling valve 62 so as to maintain a preselected subatmospheric pressure in exhaust duct 16. That pressure, together with the pressure and flow rate of the bias gas entering through the tubular electrode from source 44 cooperatively establish a selected, subatmospheric pressure within the interior of the container.

Bias radio frequency power source 52 is actuated to apply an alternating radio frequency ("RF") potential to electrode 12. Where chamber 4 is metallic and grounded, it provides a real ground potential at the wall of the chamber. However, even where the chamber is insulated (as where the chamber is formed from glass or other dielectric material), the plasma zone PZ acts as a virtual ground as further described below. Accordingly, the potential outside of the container is different from the potential applied through electrode 12. Under the influence of this potential difference, the first or biasing gas in the inside of the container ionizes. The ionized gas is electrically conductive. This ionized first or bias gas substantially fills the entire container and hence is in contact with essentially the entire interior wall surface 5 of the container. Because the ionized gas is conductive, the electrical potential applied to electrode 12 is applied at the interior wall surface.

Vacuum pump 64 and the associated feedback control system and throttling valve 72 are actuated to remove gas from the space within chamber 4 and to maintain the interior of the chamber at a selected, subatmospheric pressure which may be the same as, or different than, the subatmospheric pressure on the inside of the container.

The oxidizing gas stored in the oxidizing gas source 32 is supplied to the system at a controlled rate via the flow meter 34 and the inlet control valve 36, and conduit 37 into the inlet conduit 6. The oxidizing gas most preferably comprises an oxygen-containing gas such as $O_2$, $N_2O$, NO, air or a combination of these gases. RF power supply 42 is actuated to supply power to the electrode 8. As the oxidizing gas passes through the upstream end 38 of the inlet conduit 6, and through the plasma zone PZ, the oxidizing gas is subjected to the electric field created by the energized electrode 8. The power level and frequency applied by the RF power supply 42 to the coating electrode 8 are chosen so that the electrical field created through the electrode 8 will substantially ionize the oxidizing gas thus converting the oxidizing gas into plasma in zone PZ. As the plasma flows towards the downstream end 40 of the inlet conduit 6, the highly excited ions of the plasma recombine thereby forming highly reactive but non-ionic oxidizing activated species. These activated species are more reactive than the original oxidizing gas supplied from the gas source 32. The composition of the activated species will vary depending on the particular oxidizing gas supplied. For example, when the oxidizing gas contains $O_2$, the activated species may include monotomic oxygen and ozone. Where the oxidizing gas includes nitrogen as well as oxygen, the activated species derived from the plasma may also include NO. As the activated species flow through the downstream end 40, they enter the space defined within the vacuum chamber 4.

The organosilicon gas source 22 releases organosilicon vapor through the flowmeter 24 and the inlet control valve 26 where the rate of flow is monitored and controlled. As further discussed below, the organosilicon may include organosilanes, organosiloxanes, and combinations of these. The organosilicon vapor passes through the capillary tube 10 to the downstream end 30 of the tube. The organosilicon vapor is substantially unaltered as it passes through the capillary tube 10. That is, the organosilicon is not ionized in tube 10.

The organosilicon vapors and the activated oxidizing species enter the vacuum chamber 4. The stream of activated species passing into the chamber 4 through the downstream end 40 of the conduit 6 substantially surrounds the unaltered organosilicon vapors. Thus, the area between the outer surface 3 of the polymeric container 2 and the walls of the vacuum chamber 4 is continually supplied with a second or treatment gas including a mixture of the organosilicon and the oxidizing active species. Since the activated species are in a highly reactive state, they tend to combine with the organosilicon vapor As the organosilicon vapors and activated species in the second or treatment gas react within one another within chamber 4, they form reaction products. Ordinarily, these reaction products include oxides of silicon such as $SiO_2$, $SiO$ and mixed-valance oxides $SiO_x$. Where the oxidizing gases and/or the organosilicon vapors include nitrogen, the reaction product may also include some nitrides of silicon. The reaction products also incorporate some organic moieties derived from the organosilicon vapors. The reaction products are deposited on the exterior surface of the container 2. The deposited reaction products consist primarily of the oxides of silicon, although some of the organic moieties are also incorporated in the deposited reaction products. The depositing reaction products are influenced by the electrical potential applied through the container wall.

As noted above, the potential applied through electrode 12 is conducted by the ionized first or bias gas on the inside of the container and hence appears at the interior surface 5 of the container. The surroundings are effectively at a ground potential. Thus, where the Wall of chamber 4 itself is conductive and grounded, the chamber wall itself forms a real ground connection. However, where the chamber wall is not conductive, the plasma in plasma zone PZ acts as a conductive, "virtual" ground. The present invention is not limited by any theory of operation. However, such a virtual ground acts, with respect to the adjacent gas species and potential fields, in much the same way as a real ground connection. With either a real or a virtual ground, the RF potential at interior wall surface 5 provides one potential, whereas the real or virtual ground provides a second potential different from the first potential. These two different potentials thus define a potential field surrounding the exterior surface 3 of the container. Some or all of the gas species in the second or treatment gas on the exterior surface of the container are electrically charged. These ionic species may include some residuum of the ionic species formed in the plasma zone PZ. Moreover, the electric potential applied through electrode 12 and through the bias gas itself tends to ionize the second or treatment gas surrounding the outside of the container. Ions and electrons in the ionized second or treatment gas thus bombard the reaction products deposited on the exterior surface of the container.

Because the bias gas effectively conducts the potential from electrode 12 to the entire interior surface 5 of container 2, the electric field is applied at the entire exterior wall surface of the container. Accordingly, the deposited reaction products are subjected to bombardment under the influence of the electric potential over essentially the entire exterior wall surface of the container, apart from the exterior surfaces of neck 9 where the same are engaged by the annular seal. As will be appreciated, the ionized first or bias gas within the interior of container 2 has a small but finite impedance. Therefore, the potential applied at the interior wall surface 5 of container 2 may not be exactly the same as the potential applied to electrode 12, and may not be exactly the same at all locations on the interior wall. However, under the preferred operating conditions, the first or bias gas inside the container is highly ionized and hence highly conductive. Thus, the variation in potential from point to point along the interior wall surface 5 will be insignificant. The bias gas should be maintained under a pressure such that the bias gas forms a distinct glow discharge under the electrical conditions prevailing inside of the container. Such a glow discharge can be detected by visual examination during the process. Desirably, the bias gas pressure inside of the container is about 0.5 Torr to about 10 Torr and more preferably is about 1 Torr to about 8 Torr, about 7 Torr being particularly preferred for operation with conventional bottles. In this regard, the preferred bias gas pressures provide more effective treatment than the lower pressures.

The present invention is not limited by any theory of operation. However, it is believed that although lower pressures tend to promote ionization of the bias gas, the relatively low concentrations of ionized species prevailing at lower pressures may limit the conductivity of the ionized bias gas. In this regard, the ionized bias gas may have impedance characteristics different from those of a simple conductor such as a metal. For example, the ionized bias gas may exhibit rectifying characteristics when exposed to an RF or other alternating field. Therefore, the potential applied at the interior wall surface 5 may be partially or even totally rectified, and may in other ways be an inexact replica of the potential applied at electrode 12. Nonetheless, at least part of the electrode potential is applied at the inner wall surface through the conductivity of the bias gas.

The particular embodiment discussed above employs a coating process in accordance with the aforementioned copending, commonly assigned U.S. patent application Ser. No. 07/889,637. Thus, the composition of the second or treatment gas provided around the outside of the container, the duration of treatment and other conditions prevailing on the outside of the container may be substantially as disclosed in said prior, copending '637 application for treatment of polymeric substrates. In this particular embodiment the treatment desirably is continued for about 5 to about 300 seconds and more preferably between about 30 seconds and about 60 seconds. During this treatment time, the container is maintained at temperatures below the heat distortion or degradation temperature of the polymer constituting the container wall, typically below about 200° C., more desirably below about 100° C. and most desirably below about 60° C. For this particular coating procedure the second or treatment gas may include one or more organosilanes, organosiloxanes, or combinations thereof. Lower alkyl, alkoxy, aryl and vinyl silanes, and siloxanes and combinations thereof are preferred. Particularly preferred organosilicons include silanes and siloxanes having methyl, methoxy and vinyl functionalities. Other organosilicons which can be used include compounds having silyl and silazene functionalities. Specific compounds which can be used include methyl, dimethyl and trimethyl silanes; tetramethyl and hexamethyl disilanes and tetramethyl and hexamethyl disiloxanes. Hexamethyl disiloxane is particularly preferred. The term "vapor" is used herein to refer to the organosilicon compound in the gaseous state because these compounds usually are liquid at about room temperature or below, and are commonly handled as liquids. However, the term "vapor" should not be read as excluding compounds which are handled as gasses and remain gaseous throughout the process. Preferably, the boiling temperature of the organosilicon compound, at the subatmospheric pressures prevailing in the treatment chamber, will be below the degradation temperature of the compound, and less than the degradation temperature of the polymeric container.

In this embodiment, the alternating electrical potential applied by bias electrode 12 has a frequency between about 1 KHz and 100MHz, and more preferably between about 100 KHz and 20 MHz. The peak to peak alternating potential preferably is between about 10 volts and about 5000 volts, whereas the alternating power input may be about 0.05 watts/cm$^2$ to about 10.0 watts/cm$^2$ of container surface area. In this coating procedure, desirably, the pressure within chamber 4 is about 0.01 to about 1.0 Torr, more preferably about 1 Torr. The flow rates of the organosilicon vapor and the oxidizing gas preferably are selected to provide a silicon to oxygen atomic ratio of about 1:30 to about 1:1 and preferably about 1:10 to about 1:1 in the same gases passing into the treatment chamber.

In the preferred embodiment discussed above, the deposited reaction products form a barrier coating, i.e., a coating having substantial resistance to permeation of gaseous or volatile materials. As used in this disclosure, the term "barrier coating" refers to a coating which has substantial resistance to permeation of at least one gas selected from the group consisting of oxygen, carbon dioxide and water vapor. The most preferred barrier coatings have substantial resistance to permeation of all of these substances, and also resist permeation of other substances such as hydrocarbons, flavorants and the like. As used in this disclosure, a coating can be considered to have "substantial" resistance to permeation of oxygen if the coating itself has a permanence of less than about 0.20 cc $O_2$/100 in$^2$-day-atm. The term "oxygen barrier coating" as used herein refers to a coating having such low oxygen permanence, regardless of whether or not the coating also has substantial resistance to permeation of other substances. More preferred oxygen barrier coatings have oxygen permeance of about 0.04 cc or less, even more preferably about 0.02 cc $O_2$/100 in$^2$ day-atm.

In similar fashion, a coating has "substantial" resistance to permeation of carbon dioxide if the carbon dioxide permeance of the coating itself is less than about 0.5 cc $CO_2$/100 in$^2$-day-atm. More preferred coatings have $CO_2$ permeance less than about 0.5 cc $CO_2$/100 in$^2$-day-atm. A coating has "substantial" resistance to permeation of water if its $H_2O$ permeance is less than about 0.4 gm $H_2O$/100 in$^2$-day-atm. More preferably, the coating has $H_2O$ permeance of less than 0.04 gm $H_2O$/100 in$^2$ day-atm.

As the coatings typically are not self-supporting and cannot be tested unless the coating is present on a substrate, permeance of the coating typically is determined by measuring permeance of similar substrates with and without the coating, and correcting for any barrier effect of the substrate. The tests are conducted according to ASTM D1434 "Standard Test Method of Determining Gas Permeability of Plastic Film and Sheeting and ASTM F372, "Water Vapor Transmission Rate of Flexible Barrier Materials Via an Infrared Detection Method."

Ordinarily, the coatings are less than about 5000 angstroms thick, and typically between about 500 and about 2000 angstroms thick. The coatings typically adhere well to polymeric substrates when applied in accordance with the process discussed above. Preferred polymeric materials for container include thermoplastics such as polyethylene terephthalate, polyethylene, polypropylene, polystyrene and polyvinylchloride. Other substrates can also be used. The coatings are essentially inert with respect to all common chemicals and food ingredients and are transparent and optically clear.

The present invention can be applied in other processes as well. Thus, essentially any gas phase procedure in which electrically charged gas-phase species treat a substrate can be practiced with a hollow container or other hollow body using the apparatus and methods according to the present invention. Other coating compositions can be applied by varying the composition of the second or treatment gas applied in the chamber on the exterior of the container. In the preferred coating processes discussed above, the oxidizing gas is converted to a plasma in a plasma zone remote from the container itself. However, the treatment gas may be converted to a plasma only in the vicinity of the container itself as, for example, where the treatment gas is supplied in a substantially nonionic, unactivated or ground-state condition and converted to a plasma by the electrical potential applied between interior electrode 12 and the wall of chamber 4. The treatment gas may also be selected to etch or otherwise react with the exterior surfaces of the container rather than to coat the same. For example, the treatment gas applied to the exterior of the container in a process according to a further embodiment of the present invention may consist essentially of one or more oxidizing gases. Because the second or treatment gas applied to the exterior of the container does not mix with the first or bias gas applied within the container, the two gases can be selected independently of one another. The second or treatment gas therefore can incorporate any gas useful in conventional plasma treatment techniques such as those applied to foil, sheet or other substrates. Manifestly, the pressure prevailing on the exterior of the container the gas flow rates and the other conditions prevailing on the exterior of the container would be selected as required for the particular process, according to the conventional parameters used in treating articles other than hollow containers. Likewise, the frequency, magnitude and power level of the biasing potential applied through the biasing gas would be selected to match the corresponding characteristics of biasing potential applied in these processes through conventional bias-application devices.

In the preferred embodiments discussed above, the first or bias gas applied on the interior of the container is substantially inert, and does not produce any appreciable treatment of the container interior. However, in a Variant of the process, the first or bias gas may be a reactive gas such as an oxidizing gas or even a coating gas composition. In this case, the biasing gas may react with or otherwise coat the interior wall surfaces of the container.

In a further variant, the apparatus is arranged to move the container during treatment. As illustrated in FIG. 2, the bias gas exhaust conduit 16' extends inwardly through the wall of chamber 4' to rotary seal 100. The elastomeric seal 14' is rotatably connected to the end of conduit 16' by the rotary seal 100. An auxiliary clamping device 102 is also provided for securing the neck 9' of a bottle 2' in engagement with rotary seal 14'. A sprocket 104 is fixed to seal 14' and clamping device 102 so that the sprocket, seal and clamping device are connected together for rotation as a unit. A rotary drive motor 106 is connected to a drive shaft 108, which in turn protrudes through the wall of chamber 4' via a conventional rotary shaft feedthrough device 108, which permits rotation of the shaft relative to the wall but which nonetheless seals the space around the shaft against leakage between the chamber and the surrounding atmosphere. A drive sprocket 112 is mounted on the end of shaft 110 inside of the chamber and the drive sprocket is linked to sprocket 104, and hence to rotary seal 14' via a belt 114. Thus, drive motor 106 can be actuated to turn sprocket 102, and hence seal 14' and bottle 2' mounted thereto, during operation of the system.

The bias electrode 12' in the embodiment illustrated in FIG. 2 is a composite structure including a central tube 120 having a bias gas inlet 122 at its proximal end, outside of chamber 4' and a bias gas outlet 124 at a distal end disposed inside of the chamber. Central tube 120 is concentrically surrounded by a coolant inlet tube 126 which extends concentrically with central tube 120. A coolant outlet tube 128 concentrically surrounds tubes 120 and 126. Tube 128 is joined to the central tube 120 just short of the distal end 124 thereof. Coolant inlet tube 126 terminates just short of the seal. Thus, inlet tube 126 defines an annular passageway surrounding central tube 120, and outlet tube 128 defines a further annular passageway surrounding tube 126 and communicating with the annular passageway of tube 126 adjacent the distal end 124 of the central tube 120. The other passageways defined by tubes 126 and 128 are connected to a coolant supply device and a chiller 130 so that a liquid coolant such as chilled water can be circulated through the electrode via these passageways. The coolant passes towards the distal end of the electrode via tube 126 and back towards the proximal end, and out to the supply device via tube 128. The walls of tubes 126 and 128 form a conductive, metallic material. The RF bias power supply device (not shown) is electrically connected to electrode 12' in the same manner as discussed above with respect to the embodiment of FIG. 1. Likewise, the bias gas source is connected to bias gas inlet 122 at the proximal end of central tube 120 and a bias vacuum source (not shown) is connected to bias exhaust conduit 16'. Electrode 12' is mounted in bias exhaust conduit 16' by an electrically insulating, sealing bushing 20'. The electrode 12' protrudes through the end of exhaust conduit 16' within chamber 4' through the inside of rotary seal 100 and through annular elastomeric sealing element 14'. Thus, the electrode, the rotary seal and the elastomeric seal 14' cooperatively define an annular passageway 19' surrounding the electrode in the vicinity of the elastomeric seal 14'.

In operation, the neck 9' of bottle 2' is engaged with elastomeric seal 14' and held in engagement by clamping device 102. The motor 106 is actuated to turn the elastomeric seal 14' together with the clamping device 102 and the bottle 2' engaged therewith. Bias gas supplied through tube 120 flows into the interior of bottle 2' and out through the annular passageway 19' to exhaust duct 16'. Here again, the bias gas on the interior of bottle 2' is isolated from the surrounding space within chamber 4' by elastomeric seal 14', rotary seal 100 and exhaust duct 16'. In the same manner as discussed above, a second treatment gas is provided to the interior of chamber 4'. This second treatment gas is maintained separate from the bias or first gas inside of bottle 2' by the elastomeric seal 14' and rotary seal 19'. In the same manner as discussed above, the pressures within the chamber and within the bottle are separately controlled by separate vacuum pumps connected to bias gas exhaust duct 16' and to the main chamber 4'. Electrical power is applied in the same way to electrode 12'. Rotation of the bottle promotes more uniform exposure of the exterior surface to the treatment gas within chamber 4' and hence promotes more uniform surface treatment of the bottle. For example, where the second treatment gas now forms a coating, rotation of the bottle tends to promote formation of a more uniform coating around the circumference of the bottle.

The coolant circulating through the electrode from source 130 aids in removing heat from the electrode and hence from the interior of the container. This aids in maintaining the container at an acceptable temperature, below its heat distortion or degradation temperature, even where relatively high power levels are applied for relatively long periods. In other respects, the embodiment illustrated in FIG. 2 operates in the same way as the embodiment of FIG. 1.

In the embodiments discussed above, the bias gas circulates into and out of the interior of the container during the treatment process. Such circulation is not essential, particularly where the bias gas provided on the interior of the container is inert with respect to the container and hence is not consumed during the process. Thus, instead of circulating the bias gas through the container continually during the process, the interior of the container can be purged with the bias gas and then brought to the desired pressure and is sealed so that such pressure is maintained during the process. In this variant as well, however, the electrode should be in electrical contact with the bias gas inside the container.

As can be appreciated, numerous further variations and combinations of the features discussed above can be utilized without departing from the present invention as defined by the claims. Thus, the foregoing description of the preferred embodiments should be taken by way of illustration rather than by way of limitation of the present invention as defined by the following claims.

I claim:

1. Apparatus for treating a hollow article comprising:
   (a) a first electrode;
   (b) first gas application means for providing a first gas on the inside of a hollow article so that said first gas contacts said electrode and substantially fills said article;
   (c) second gas application means for providing a second gas including electrically charged species on the outside of said article
   (d) separation means for maintaining said second gas separate from said first gas; and
   (e) first potential application means for maintaining said first gas in an electrically conductive state and applying a first electrical potential to said first electrode whereby said first potential is substantially uniformly applied at the interior surfaces of said article and said electrically charged species in said second gas interact with the exterior surfaces of said article under the influence of said first potential.

2. Apparatus as claimed in claim 1 wherein said first gas application means includes means for maintaining said first gas under a first subatmospheric pressure within said article.

3. Apparatus as claimed in claim 1 wherein said second gas application means includes means for maintaining said second gas under a pressure different from said first subatmospheric pressure.

4. Apparatus as claimed in claim 1 further comprising means for positioning said article and said first electrode relative to one another so that said electrode is disposed at least partially within said hollow article.

5. Apparatus as claimed in claim 4 wherein said first electrode defines a passageway communicating with the interior of said hollow article when said electrode is disposed within said hollow article and said first gas application means includes means for circulating said first gas through said passageway.

6. Apparatus as claimed in claim 5 wherein said separation means includes an annular sealing element encircling said first electrode, said first electrode being elongated and projecting in an axial direction from said sealing element, said means for positioning including means for positioning said article so that said projecting electrode extends into said article through an opening surrounded by wall structure of the article and so that said sealing element sealingly engages such surrounding wall structure.

7. Apparatus as claimed in claim 6 wherein said first gas application means includes means for circulating said first gas alongside said electrode, within said sealing element and the article wall structure engaged therewith.

8. Apparatus as claimed in claim 5 wherein said first electrode is elongated, said passageway extends generally lengthwise along said first electrode and said first electrode includes a plurality of openings extending between said passageway and the exterior of said electrode at locations spaced apart from one another along the length of said electrode.

9. Apparatus as claimed in claim 5 further comprising cooling means for cooling said first electrode.

10. Apparatus as claimed in claim 1 wherein said second gas application means includes a treatment chamber and means for providing said second gas within said treatment chamber.

11. Apparatus as claimed in claim 10 further comprising means for moving the article within the treatment chamber during application of said first and second gases.

12. Apparatus as claimed in claim 10 further comprising means for introducing a reactant into said treatment chamber so that said reactant reacts with said second gas in said treatment chamber.

13. Apparatus as claimed in claim 12 further comprising vacuum exhaust means disposed for communication with said treatment chamber for maintaining said second gas and said reactant under a sub-atmospheric pressure.

14. Apparatus as claimed in claim 13 wherein said vacuum exhaust means is disposed directly opposite said means for providing said second gas within said treatment chamber.

* * * * *

UNITED STATES PATENT AND TRADEMARK OFFICE
CERTIFICATE OF CORRECTION

PATENT NO.   : 5,374,314
DATED        : December 20, 1994
INVENTOR(S)  : Robert J. Babacz It is certified that error appears in the above-indentified patent and that said Letters Patent is hereby corrected as shown below:

Column 3, line 38, "With" should read --with--.

Column 5, line 31, after "sensor 72" insert -- is --.

Column 5, line 37 "SO" should read -- so --.

Column 5, line 52, "Vacuum" should read -- vacuum --.

Column 9, line 36, "Wall" should read -- wall --.

Column 11, line 24, "about 1" should read -- about .1 --.

Column 11, line 43 , "permanence" should read -- permeance --.

Column 11, line 46, "permanence" should read -- permeance --.

Column 12, line 62, "Variant" should read -- variant --.

Signed and Sealed this

Eleventh Day of April, 1995

*Attest:*

BRUCE LEHMAN

*Attesting Officer*   Commissioner of Patents and Trademarks